United States Patent
Ogino

(10) Patent No.: US 7,928,014 B2
(45) Date of Patent: Apr. 19, 2011

(54) METHOD FOR MANUFACTURING A SEMICONDUCTOR DEVICE INCLUDING A SILICON FILM

(75) Inventor: Satoshi Ogino, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 802 days.

(21) Appl. No.: 11/812,423

(22) Filed: Jun. 19, 2007

(65) Prior Publication Data
US 2007/0293051 A1 Dec. 20, 2007

(30) Foreign Application Priority Data

Jun. 20, 2006 (JP) .................................. 2006-170376

(51) Int. Cl.
*H01L 21/302* (2006.01)
*H01L 21/461* (2006.01)

(52) U.S. Cl. ........ 438/719; 438/725; 438/727; 438/730; 438/905

(58) Field of Classification Search .................. 438/719, 438/725, 727, 730, 905
See application file for complete search history.

(56) References Cited

U.S. PATENT DOCUMENTS

| | | | | | |
|---|---|---|---|---|---|
| 5,431,772 | A | * | 7/1995 | Babie et al. | 438/714 |
| 5,869,401 | A | * | 2/1999 | Brunemeier et al. | 438/710 |
| 6,003,526 | A | * | 12/1999 | Lo et al. | 134/1.1 |
| 6,090,718 | A | * | 7/2000 | Soga et al. | 438/714 |
| 6,379,575 | B1 | * | 4/2002 | Yin et al. | 216/67 |
| 6,872,322 | B1 | * | 3/2005 | Chow et al. | 216/67 |
| 7,098,139 | B2 | * | 8/2006 | Tabaru | 438/706 |
| 2002/0092541 | A1 | * | 7/2002 | Yokogawa et al. | 134/1.2 |
| 2002/0162827 | A1 | * | 11/2002 | Yeh et al. | 219/121.41 |
| 2003/0141820 | A1 | * | 7/2003 | White et al. | 315/111.21 |
| 2004/0018727 | A1 | * | 1/2004 | Yokogawa et al. | 438/689 |
| 2004/0082186 | A1 | * | 4/2004 | Okamoto | 438/709 |
| 2004/0110388 | A1 | * | 6/2004 | Yan et al. | 438/710 |

FOREIGN PATENT DOCUMENTS

JP    9-64017    3/1997

* cited by examiner

*Primary Examiner* — Matthew S Smith
*Assistant Examiner* — John M Parker
(74) *Attorney, Agent, or Firm* — Young & Thompson

(57) ABSTRACT

A method for manufacturing a semiconductor device includes: mounting a wafer having an exposed silicon nitride film, on an electrode received in a plasma chamber; dry-cleaning the chamber to remove reaction products accumulated on the wall and ceiling of the chamber, anisotropic-etching the silicon nitride film and an underlying silicon film for patterning; and removing the wafer from the chamber. The method repeats the treatment for a number of semiconductor wafers.

9 Claims, 5 Drawing Sheets

METHOD FOR MANUFACTURING A SEMICONDUCTOR DEVICE INCLUDING A SILICON FILM

This application is based upon and claims the benefit of priority from Japanese patent application No. 2006-170376, the disclosure of which is incorporated herein in its entirety by reference.

BACKGROUND OF THE INVENTION (a) Field of the Invention

The present invention relates to a method for manufacturing a semiconductor device and, more particularly, to a method for manufacturing a semiconductor device including the step of etching a silicon nitride film and a silicon film.

(b) Description of the Related Art

In semiconductor memory devices, such as a DRAM or flash memory, gate electrodes having a poly-metal structure are increasingly used. The poly-metal structure is such that the gate electrodes or interconnections include a polysilicon layer and an overlying metallic layer such as a tungsten (W) layer. FIG. 4 shows a conventional poly-metal structure. The gate electrode shown therein is formed on a silicon substrate via a gate insulation film 11, and includes a polysilicon film 12, a tungsten nitride (WN) film 13 and a tungsten (W) film 14 consecutively as viewed from the silicon substrate 10. The top of gate electrode is covered by a silicon nitride film and a silicon oxide film 16, which are used as a hard mask for patterning the gate electrode. The side surface of the gate electrode and hard mask is also covered by a sidewall silicon nitride film 17.

In the gate electrode structure as described above, the tungsten film having a lower resistivity is used for reducing the line resistance of the gate electrode having a smaller width. However, since the tungsten film, if formed directly on the gate insulation film, will adversely affect the transistor characteristics of the MOSFET due to the variation in the interface level in the tungsten, the polysilicon film 12 is interposed between the tungsten film 14 and the gate oxide film 11 to configure the poly-metal structure.

In addition, in the structure of FIG. 4, the tungsten nitride film 13 having a small thickness is interposed between the tungsten film 14 and the polysilicon film 12 for maintaining the film quality of the tungsten film 14 and controlling the interface resistance. Further, the sidewall oxide film 17 prevents tungsten in the tungsten film from falling to attach and contaminate the gate insulation film 11.

The gate electrode having the above poly-metal structure is manufactured by a process shown in FIGS. 5 to 8. Polysilicon film 12, tungsten nitride film 13, tungsten film 14, silicon nitride film 15 and silicon oxide film 16 are consecutively deposited on a gate insulation (oxide) film 11, followed by patterning the silicon nitride film 15 and silicon oxide film 16 to form a hard mask by using a photoresist mask.

After removing the photoresist mask, or while leaving the photoresist mask as it is, the tungsten film 14 is patterned using the hard mask 15, 16 as an etching mask. This patterning step is stopped after slightly etching a top portion of the polysilicon film 12 to leave a non-etched portion of the polysilicon film 12, as shown in FIG. 5.

Thereafter, a thin silicon nitride film 17a is deposited on the entire surface, as shown in FIG. 6. The silicon nitride film 17a is then etched using an anisotropic etching technique to leave the sidewall silicon nitride film 17 on the side surface of the gate electrode structure, as shown in FIG. 7. The remaining polysilicon film 12 exposed from the sidewall silicon nitride film 17 is then etched using an anisotropic etching technique to obtain the gate electrode structure as shown in FIG. 8.

The etching of the silicon nitride film 17a and polysilicon layer 12 is conducted in a single chamber, although different etching conditions are used therefor. For example, after the etching of the silicon nitride film 17a is finished, the plasma discharge is stopped in the chamber, and again started using a different recipe to etch the polysilicon film 12 in the same chamber. Such an anisotropic etching process using the plasma etching system is described in Patent Publication JP-1997-64017A, for example.

In general, the etching treatment generates reaction products, which gradually accumulate in the etching chamber during the etching treatment for a plurality of wafers. For the case of etching the gate polysilicon film, reaction products include silicon (Si) compounds. FIG. 1 shows the situation of the reaction products accumulated in the etching chamber. It is shown that the reaction products 26 are attached on the wall and ceiling of the etching chamber 21 in FIG. 1. The reaction products thus accumulated cause problems as detailed hereinafter.

First, the process condition varies due to the accumulated reaction products. More specifically, the proceeding of the etching treatment gradually changes the atmosphere within the chamber 21, whereby the thickness or shape of the film formed by the etching treatment changes within a lot or between lots. For example, the accumulation of the reaction products in the chamber increases the line with of the interconnections patterned on the wafer, and changes the side surface of the interconnections from a vertical plane to an inclined plane.

Second, particles fall from the accumulated reaction products. More specifically, an excessive amount of reaction products, if accumulated on the wall or ceiling of the chamber, causes particles to fall from the reaction products onto the wafer now subjected to the etching treatment and to contaminate the atmosphere of the chamber. For avoiding the fall of the particles, dry cleaning of the etching chamber is generally performed. The dry cleaning of the etching chamber uses a specific condition different from the condition of the anisotropic etching, the specific condition using plasma discharge suited to removing the reaction products.

Techniques for the dry cleaning include a first technique using a dummy wafer in the dry cleaning for each lot of target wafers to be etched, and a second technique using wafer-less dry cleaning for each target wafer to be etched. The first technique is shown in the flowchart of FIG. 9. In this example, wafers of a single lot to be etched includes 25 wafers, and a dummy wafer is used in the dry cleaning (step S21) before etching wafers of the lot in step S22. In the first technique, since an electrode 22 (FIG. 1) on which the target wafer is to be mounted is covered by the dummy wafer during the dry etching, the electrode 22 is not damaged after the dry cleaning is performed even for a relatively long time. The first technique, however, has a disadvantage in that use of the dummy wafer raises the total cost for the etching treatment. In addition, since the wafers in the lot are sequentially subjected to the etching treatment, a wafer appearing in the finial stage of the lot is more liable to the fall of the reaction products than another wafer appearing in the initial stage of the lot, due to the undesirable variation in the process condition within the chamber.

The second technique is shown in the flowchart of FIG. 10, wherein the wafer-less dry cleaning in step S31 is conducted before every etching treatment in step S32 for the target wafer. The wafer-less cleaning is also referred to as in-situ cleaning. The second technique removes the reaction products generated in the etching treatment for a single target wafer, before performing a subsequent etching step. This technique reduces the cost for the dummy wafer and suppresses the variation in the process condition.

The main stream of the current cleaning technique is directed to the wafer-less cleaning. The wafer-less cleaning, however, has disadvantages as detailed below. First, the electrode is damaged in the wafer-less cleaning because the electrode is directly exposed to the plasma, to thereby have a shorter lifetime. The damages on the electrode include etching of the electrode itself, which causes flaw or crack on the surface and degradation of flatness on the surface. These damages may reduce the electrostatic absorption power of the electrode and obstacle transfer of the wafers due to the misalignment of the wafers with respect to the electrode and thus a carriage for the wafers.

Second, the electrode causes metallic contamination. The electrode is generally made of ceramic, which includes therein heavy metals such as Ti and Zn in an amount depending on the manufacturer. The dry cleaning scatters the heavy metals, which attach onto the wall or ceiling of the etching chamber, and fall onto the product wafers thereby causing contamination of the final products. The metallic contamination should be avoided especially in the case of plasma etching of the gate polysilicon film, because the gate oxide film is exposed during the etching and the metallic atoms degrade the transistor characteristics if attached onto the gate oxide film.

SUMMARY OF THE INVENTION

In view of the above problems in the conventional technique, it is an object of the present invention to provide a method for manufacturing a semiconductor device, which is capable of suppressing the damages on the electrode and the metallic contamination on the product wafers caused by the metallic contamination.

The present invention provides, in one aspect, a method for manufacturing a semiconductor device, including an etching treatment including for each wafer the consecutive steps of: mounting a semiconductor wafer on an electrode received in a chamber of a plasma etching system, the semiconductor wafer including a first film covering a surface of the semiconductor wafer including a surface of a silicon film; dry-cleaning an internal of the chamber such that an etch selectivity of the silicon film with respect to the first film is a specific value or above; consecutively anisotropic-etching the first film and the silicon film on the wafer by using a specific plasma etching condition; and removing the semiconductor wafer from the chamber after the anisotropic etching, the method repeating the etching treatment for a plurality of wafers.

The present invention provides, in another aspect, a method for manufacturing a semiconductor device including the consecutive steps of: forming a gate oxide film on a surface of a semiconductor wafer; consecutively forming polysilicon film, metallic film and insulator film on the gate oxide film; anisotropic-etching the insulator film, metallic film and polysilicon film to form a gate electrode pattern; forming a silicon nitride film on a substantially entire surface of the semiconductor wafer; mounting the wafer on an electrode received in a chamber of a plasma etching system; dry-cleaning an internal of the chamber; anisotropic-etching the silicon nitride film in the chamber; anisotropic-etching the silicon film in the chamber; and removing the semiconductor wafer from the chamber.

The above and other objects, features and advantages of the present invention will be more apparent from the following description, referring to the accompanying drawings.

PREFERRED EMBODIMENT OF THE INVENTION

Figure 5:
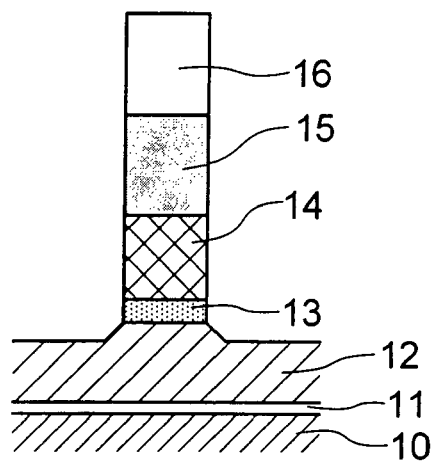
FIGS. 5 to 8 are sectional views showing consecutive steps of a fabrication process for obtaining the structure of FIG. 4.
Figure 6:
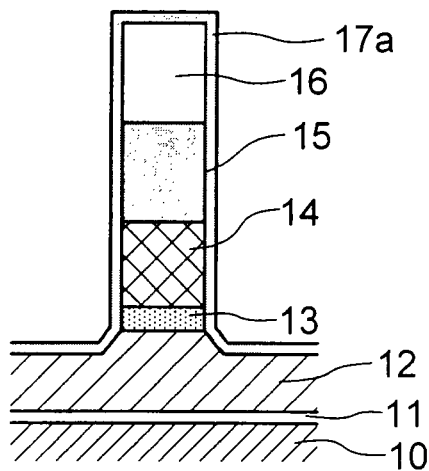
Figure 7:
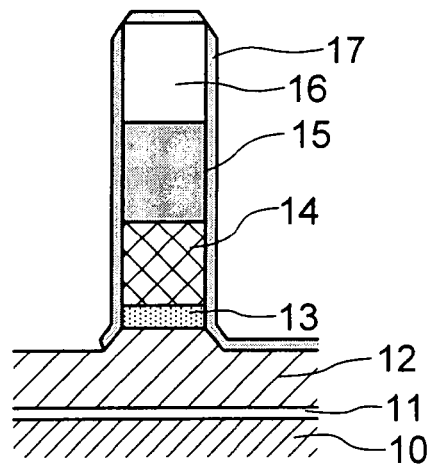
Figure 8:
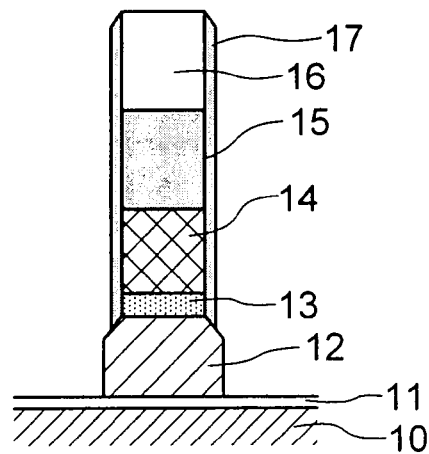
Figure 9:
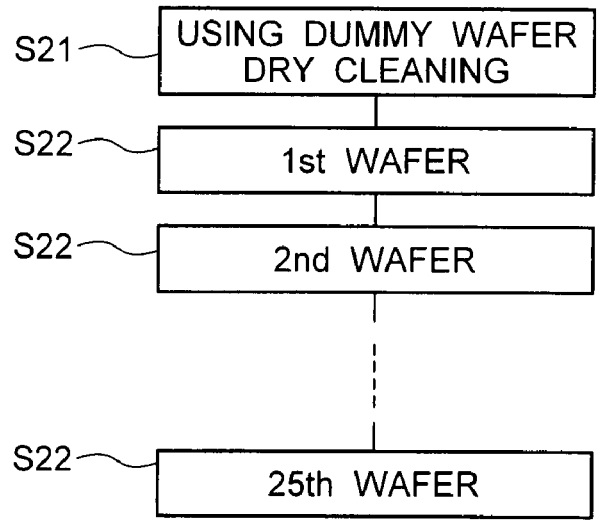
FIG. 9 is a flowchart showing a conventional dry cleaning process.
Figure 10:
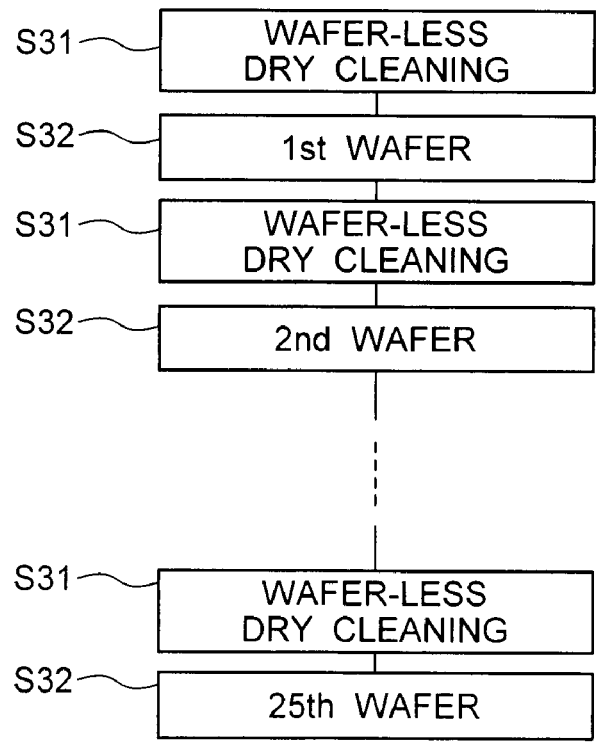
FIG. 10 is a flowchart showing another conventional dry cleaning process.

Now, an exemplary embodiment of the present invention will be described with reference to accompanying drawings. FIGS. 5 to 8 as described before shows a typical process for forming the metal-gate structure in a semiconductor device. In particular, FIG. 6 shows the step before etching a silicon nitride film and a polysilicon film.

The structure of FIG. 6 is obtained as follows. A gate oxide film 11 having a thickness of 3.6 nm is formed using a thermal oxidation technique on a silicon substrate or wafer 10. Subsequently, a 70-nm-thick polysilicon film 12 including phosphor therein is formed thereon by a CVD (chemical vapor deposition) process using a source gas including monosilane ($SiH_4$) and phosphine ($PH_3$). The polysilicon film 12 is preferably formed by depositing silicon in an amorphous state and heat treating the amorphous silicon to form a polysilicon film. For example, the amorphous silicon film is deposited at a temperature of 430 degrees C., and heat treated at a temperature of 700 degrees C. to form the polysilicon film.

The polysilicon film thus formed has an excellent flat top surface and is more suitable to the fine patterning process than the ordinary polysilicon film deposited in the polycrystalline state. In addition, the crystallizing heat treatment at 700 degrees C. activates the phosphor in the silicon film for achieving a superior conductivity of the silicon film, and allows the resultant silicon film to have an n-type conductivity. If phosphine is not used in the source gas during the deposition of the amorphous silicon film, the amorphous silicon film may be doped with a p-type dopant by using an ion-implantation technique and then subjected to the crystallizing heat treatment to form a p-type semiconductor film.

Thereafter, a sputtering process is conducted to deposit a metallic film on the polysilicon film 12, the metallic film including, for example, a 10-nm-thick tungsten nitride (WN) film 13 and a 55-nm-thick tungsten (W) film. A tungsten silicide ($WSi_2$) film may also be interposed between the polysilicon film 12 and the tungsten nitride film 13. The interposition of the tungsten silicide film 13 effectively reduces the contact resistance occurring between the polysilicon film 12 and the tungsten nitride film 13.

An insulator film is then deposited on the metallic film, the insulator film including a 140-nm-thick silicon nitride film 15 and an 80-nm-thick silicon oxide film 16 which are deposited in this order. The source gas for the silicon nitride film 15 includes monosilane and ammonia ($NH_3$), whereas the source gas for the silicon oxide film 16 includes monosilane and dinitrogen monoxide ($N_2O$). The insulator film is deposited using a plasma-enhanced CVD process.

Thereafter, a photoresist mask pattern is formed on top of the silicon oxide film 16 by using a photolithographic technique. The silicon oxide film 16 and silicon nitride film 15 are then patterned by a plasma anisotropic etching process using fluorine-containing plasma. The etching gas may include octafluorocyclopentane ($C_5O_8$) etc. as a main component thereof.

Subsequently, the photoresist mask pattern is removed, and an anisotropic etching process is conducted using another photoresist mask and chlorine-containing plasma to etch the tungsten film 14 and tungsten nitride film 13. In this anisotropic etching, the tungsten nitride film 13 is over-etched to a level within the polysilicon film 12 which is 20 to 30 nm below the original top surface thereof, as shown in FIG. 5.

Thereafter, a 13-nm-thick silicon nitride film 17a is deposited on the entire surface. In the deposition of the silicon nitride film 17a, a CVD process is employed while using a source gas including dichlorosilane ($SiH_2Cl_2$) and ammonia. Since the tungsten film 14 is extremely liable to oxidation, a filming system should have the structure wherein the tungsten film 14 is scarcely oxidized until the silicon nitride film 17a is formed.

The CVD process for the silicon nitride film 17a may be replaced by an ALD (atomic layer deposition) process, which is more preferable for suppression of oxidation of the tungsten film because the ALD process may use a lower temperature than the CVD process.

Figure 1:
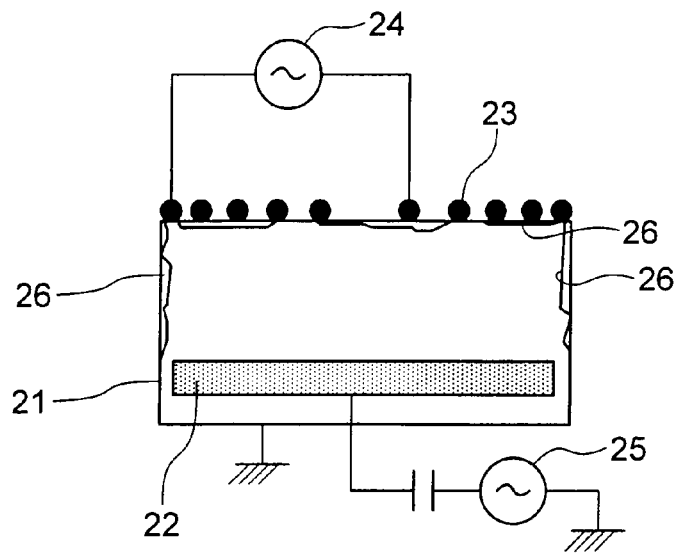
FIG. 1 is a sectional view of an example of a plasma etching system using a method according to an exemplary embodiment of the present invention.

FIG. 1 exemplifies a plasma etching system for use in etching the gate polysilicon film. The plasma etching system includes a chamber 21, and a coil 23 disposed on top of the chamber 21 for receiving plasma-exciting radio-frequency (RF) power from a plasma-exciting RF power source unit 24. The plasma etching system also includes an electrode 22 on which a target wafer is mounted, and a bias RF power source unit 25 which provides bias RF power to the electrode 22. The coil 23 excites plasma within the chamber 21, whereas the electrode 22 applied with bias RF power attracts ions in the plasma toward the wafer mounted thereon for effecting the plasma etching.

Figure 2:
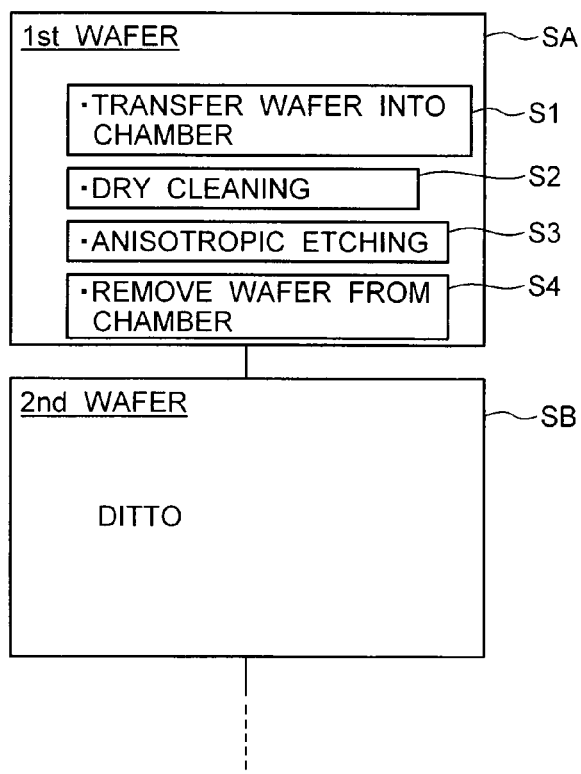
FIG. 2 is a flowchart of a process for manufacturing a semiconductor device according to the exemplary embodiment.

FIG. 2 shows a process for the etching treatment according to the exemplary embodiment by depicting the etching treatment for each wafer. This process does not use conventional wafer-less dry cleaning. A first product wafer is transferred into the chamber and mounted on the electrode (step S1). Subsequently, the chamber is subjected to dry cleaning in step S2, and the product wafer is subjected to the ordinary anisotropic etching in step S3. After the anisotropic etching, the product wafer is removed from the chamber in step S4, thereby completing the etching treatment for the first product wafer (step SA). A second product wafer is also subjected to a similar procedure (step SB), and subsequent product wafers in the same lot including 25 wafers are subjected to a similar procedure.

The dry cleaning step S2 uses a significantly higher etch selectivity of the polysilicon film with respect to the silicon nitride film. This is intended to effectively etch the reaction products including silicon compounds attached onto the wall or ceiling of the chamber selectively from the silicon nitride film formed on top of the wafer. It is to be noted that the etch rate for such reaction products is considered substantially equal to the etch rate for the polysilicon film. A preferable etch selectivity for polysilicon with respect to silicon nitride in the dry cleaning is 100 or above, for example. The preferable etch selectivity is achieved by, for example, a process condition including: gas flow rate of $Cl_2/O_2$ at 270/3 sccm (standard cubic centimeters); chamber pressure at 4.5 mTorr; plasma excitation RF power at 400 watts; and bias RF power at zero watt. This condition is selected in consideration of the following facts.

Bias Power

Figure 3:
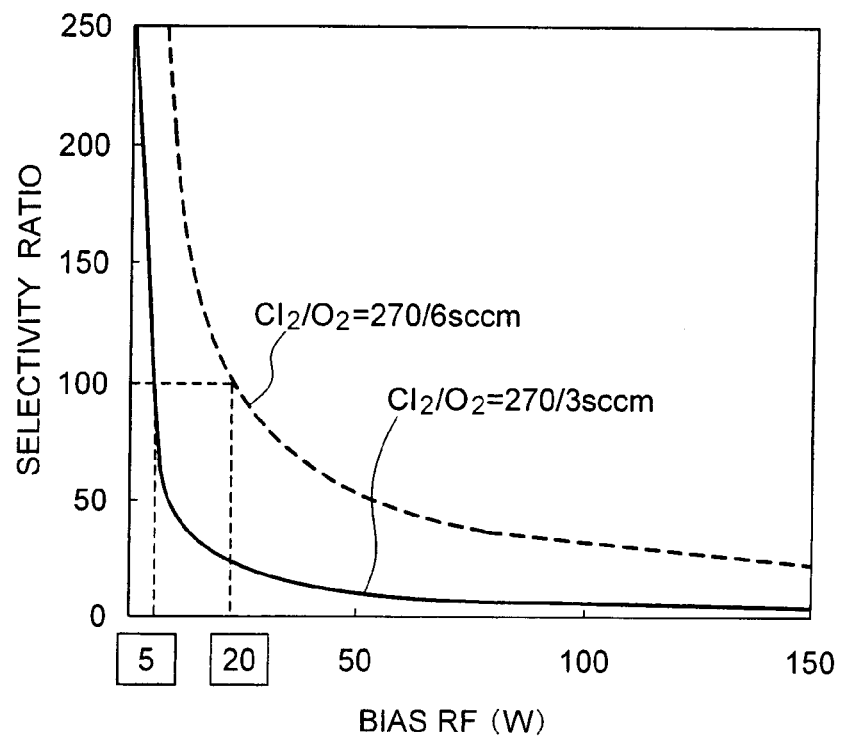
FIG. 3 is a graph showing the bias power dependency of the etch selectivity of silicon with respect to silicon oxide in a process condition used in the exemplary embodiment.
Figure 4:
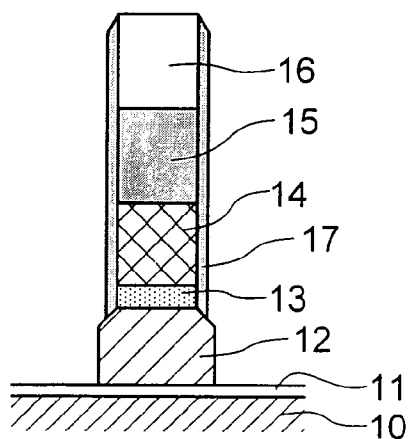
FIG. 4 is a sectional view of the final layer structure of the gate electrode in a wafer etched by the method of the exemplary embodiment.

In general, a lower bias power provides a higher etch selectivity for the polysilicon film with respect to the silicon nitride film. In addition, this bias power dependency of the etch rate is more drastic with a lower plasma excitation power. A solid line in FIG. 3 shows the bias power dependency of the etch selectivity of the polysilicon film with respect to the silicon nitride film for the flow rate of $Cl_2/O_2$ set at 270/3 sccm. The target etch selectivity of 100 or higher is achieved by a bias power of 5 watts or lower.

Flow Rate Ratio of $(O_2+N_2)/Cl_2$

A higher $O_2$ flow rate ratio provides a higher etch selectivity. FIG. 3 also shows the bias power dependency of the etch selectivity by a dotted line for the flow rate of $Cl_2/O_2$ set at 270/6 sccm, i.e., for the case where the $O_2$ flow rate is increased up to 6 sccm. In this case, the target etch rate of 100 or higher is achieved by a bias power of 20 watts or lower. It is to be noted here that it is the flow rate ratio of $CL_2/O_2$, and not the absolute value of the $O_2$ flow rate, that achieves the target etch selectivity. In this case, the $O_2$ flow rate of 3 sccm corresponds to a flow rate ratio of 1.1% for $O_2/Cl_2$ whereas the $O_2$ flow rate ratio of 6 sccm corresponds to a flow rate ratio of 2.2%. Part of $O_2$ may be replaced by $N_2$ for obtaining a similar result, so long as the total flow rate of $(O_2+N_2)$ is equal to the above flow rate.

Other Parameters

In general, a higher chamber pressure or a higher plasma excitation power provides a higher etch selectivity. Accordingly, the target etch selectivity of the polysilicon film with respect to the silicon nitride film is obtained by the range wherein: $O_2/Cl_2$ flow rate ratio is 1.5% or higher; chamber pressure is 4.5 mTorr or higher; plasma excitation power is 400 watts or higher; and bias power is between zero and 5 watts inclusive of both, with or without replacement of part of $O_2$ by $N_2$ provided that the total flow rate ratio is maintained at the above flow rate ratio.

The target etch selectivity of the polysilicon film with respect to the silicon nitride film is analyzed as follows. As to the silicon nitride film, the controllability of the pattern in the etching treatment is assured so long as the etched depth or etched amount of the silicon nitride film is 1 nm or below. This is because the range of variation in the etched depth within wafer, between wafers or among the wafers in a lot is maintained at 1 nm or below due to the etched depth of 1 nm or below, and this range of variation is far below the range of variation at 4 to 5 nm in the etched depth generally achieved in the conventional etching technique.

As to the polysilicon, the amount of reaction products generated from a wafer including the polysilicon film having a thickness of around 100 nm or below during the etching process corresponds to a thickness of 100 nm at most for the reaction products accumulated on the wall or ceiling of the chamber, assuming that all the material of the etched polysilicon is changed to the reaction products and accumulated in the chamber. Thus, a cleaning process achieving removal of 100-nm-thick polysilicon will suffices an etching process conducted for a single wafer. Accordingly, it is sufficient in the embodiment that the cleaning process achieve an etch selectivity of 100 or above for the polysilicon film with respect to the silicon nitride film.

By adopting the above process, the following advantages can be obtained. First, dry cleaning of the chamber is accomplished without incurring the etching of the product wafer covered with the silicon nitride film. This prevents an adverse influence on the controllability of the dimensions on the fine pattern achieved by the gate etching treatment. Second, the electrode is scarcely damaged during the dry cleaning. This results in prevention of deviation of wafer from the electrode which may be otherwise caused by an insufficient electrostatic absorption power of the electrode. In addition, the electrode has a longer lifetime to achieve reduction in the cost for exchange of the electrode. Third, metallic contamination of the product wafer by heavy metals can also be suppressed.

The method of the present invention is suited to fabrication of DRAM, flash memory and a semiconductor device including therein these memories.

While the invention has been particularly shown and described with reference to an exemplary embodiment thereof, the invention is not limited to the embodiment. It will be understood by those of ordinary skill in the art that various changes in form and details may be made therein without departing from the spirit and scope of the present invention as defined in the claims.

What is claimed is:

1. A method for manufacturing a semiconductor device, comprising an etching treatment including for each wafer the consecutive steps of:
   mounting a semiconductor wafer on an electrode received in a chamber of a plasma etching system, said semiconductor wafer including a first film covering a surface of said semiconductor wafer including a surface of a silicon film;
   dry-cleaning an internal of said chamber such that an etch selectivity of said silicon film with respect to said first film is a specific value or above;
   consecutively anisotropic-etching said first film and said silicon film on said wafer by using a specific plasma etching condition; and
   removing said semiconductor wafer from said chamber after said anisotropic etching, said method repeating said etching treatment for a plurality of wafers,
   wherein said dry-cleaning step applies a plasma excitation power to a coil associated with said chamber, and a bias power to said electrode, and achieves an etch selectivity of 100 or above for silicon with respect to silicon nitride, and said first film includes a silicon nitride film.

2. The method according to claim 1, wherein said dry-cleaning step uses a process condition where said plasma excitation power is 400 watts or above, said bias power is between zero watt and 5 watts inclusive of both, a chamber pressure is 4.5 mTorr or above, a percent ratio of a flow rate of $O_2$ introduced in said chamber or $O_2$ and $N_2$ introduced in said chamber with respect to a flow rate of $Cl_2$ introduced in said chamber is 1.5% or above.

3. A method for manufacturing a semiconductor device comprising the consecutive steps of:
   forming a gate oxide film on a surface of a semiconductor wafer;
   consecutively forming polysilicon film, metallic film and insulator film on said gate oxide film;
   anisotropic-etching said insulator film, metallic film and polysilicon film to form a gate electrode pattern;
   forming a silicon nitride film on a substantially entire surface of said semiconductor wafer;
   mounting said wafer on an electrode received in a chamber of a plasma etching system;
   dry-cleaning an internal of said chamber;
   anisotropic-etching said silicon nitride film in said chamber;
   anisotropic-etching said silicon film in said chamber; and
   removing said semiconductor wafer from said chamber.

4. The method according to claim 3, wherein said method repeats said consecutive steps for a plurality semiconductor wafers.

5. The method according to claim 3, wherein said metallic film includes at least one of metallic film without an additive, metal nitride film, and metal silicide film.

6. The method according to claim 3, wherein said insulator film includes at least one of silicon oxide film and silicon nitride film.

7. The method according to claim 3, wherein said dry-cleaning step applies a plasma excitation power to a coil associated with said chamber, and a bias power to said electrode, and achieves an etch selectivity of 100 or above for silicon with respect to silicon nitride.

8. The method according to claim 7, wherein said dry-cleaning step uses a process condition where said plasma excitation power is 400 watts or above, said bias power is between zero watt and 5 watts inclusive of both, a chamber pressure is 4.5 mTorr or above, a percent ratio of a flow rate of $O_2$ introduced in said chamber or $O_2$ and $N_2$ introduced in said chamber with respect to a flow rate of $Cl_2$ introduced in said chamber is 1.5% or above.

9. The method according to claim 3, wherein said dry-cleaning step etches said silicon nitride film in an etched depth of 1 nm or below.

* * * * *